(12) United States Patent
Manfroy et al.

(10) Patent No.: US 7,506,792 B1
(45) Date of Patent: Mar. 24, 2009

(54) SOLDER SPHERE PLACEMENT APPARATUS

(76) Inventors: John V. Manfroy, 150 San Lazaro Ave., Sunnyvale, CA (US) 94086; William Manfroy, 4727 Calle de Lucia, San Jose, CA (US) 95124; Timothy G. Hoffman, 6251 Empress Ct., San Jose, CA (US) 95128

( * ) Notice: Subject to any disclaimer, the term of this patent is extended or adjusted under 35 U.S.C. 154(b) by 136 days.

(21) Appl. No.: 11/744,468

(22) Filed: May 4, 2007

(51) Int. Cl.
B23K 1/00 (2006.01)
B23K 35/12 (2006.01)

(52) U.S. Cl. .............................. 228/41; 228/33; 228/246

(58) Field of Classification Search .................... 228/41, 228/33; 294/64.1; 29/743
See application file for complete search history.

(56) References Cited

U.S. PATENT DOCUMENTS

| | | | | |
|---|---|---|---|---|
| 3,404,845 | A * | 10/1968 | Gerhard et al. | 239/556 |
| 3,523,707 | A * | 8/1970 | Roth | 294/65 |
| 4,881,770 | A * | 11/1989 | Marzinotto et al. | 294/64.1 |
| 5,373,984 | A * | 12/1994 | Wentworth | 228/180.1 |
| 5,749,614 | A * | 5/1998 | Reid et al. | 294/64.1 |
| 6,176,008 | B1 * | 1/2001 | Ueoka | 29/743 |
| 6,202,918 | B1 * | 3/2001 | Hertz | 228/246 |
| 6,230,963 | B1 * | 5/2001 | Hertz | 228/246 |
| 6,279,816 | B1 * | 8/2001 | Nakajima et al. | 228/246 |
| 6,352,189 | B1 * | 3/2002 | Kobayashi | 228/8 |
| 6,412,685 | B2 * | 7/2002 | Hertz et al. | 228/246 |
| 6,460,755 | B1 * | 10/2002 | Inoue et al. | 228/246 |
| 6,510,977 | B1 * | 1/2003 | Hertz | 228/246 |
| 6,536,105 | B1 * | 3/2003 | Sakai et al. | 29/843 |
| 6,571,007 | B1 * | 5/2003 | Shimokawa et al. | 382/147 |
| 6,805,274 | B2 * | 10/2004 | Inoue | 228/39 |
| 6,926,188 | B2 * | 8/2005 | Hazeyama et al. | 228/41 |
| 7,293,354 | B2 * | 11/2007 | Ferland et al. | 29/846 |
| 2001/0008249 | A1 * | 7/2001 | Hertz et al. | 228/246 |
| 2001/0015372 | A1 * | 8/2001 | Yamamoto et al. | 228/180.22 |
| 2005/0274003 | A1 * | 12/2005 | Lee | 29/743 |

* cited by examiner

*Primary Examiner*—Jessica L Ward
*Assistant Examiner*—Carlos Gamino
(74) *Attorney, Agent, or Firm*—Allen D. Hertz

(57) ABSTRACT

A method and apparatus are disclosed for placing solder spheres on electronic receiving pads of a ball grid array (BGA) component package, such as by a BGA solder sphere placement apparatus. The solder spheres are held to a pattern of solder sphere apertures in a foil and against a solder sphere backing rib of a second layer by a vacuum holding force. After locating the solder spheres to receiving pads of a BGA component package, the system removes the holding force and the solder spheres are then released and placed on the receiving pads. Optionally, the apparatus can ensure release of the solder spheres as well as seating the solder spheres onto the receiving pads by applying a tapping or vibrational force.

20 Claims, 12 Drawing Sheets

SOLDER SPHERE PLACEMENT APPARATUS

FIELD OF THE INVENTION

This invention relates in general to the field of solder sphere placement systems for surface mount technology, and in particular to a method and apparatus for placing solder balls on electronic pads that are on a substrate such as for a ball grid array (BGA) package.

BACKGROUND OF THE INVENTION

Conventional methods for manufacturing surface mount components, or for manufacturing circuit supporting substrates for surface mount components, typically include methods for placing conductive preforms, e.g., solder balls, solder spheres, preformed solder bumps, and the like on electronic pads arranged in a predetermined placement pattern that is sometimes called a ball grid array (BGA). The term "Solder spheres" is used herein being representative of the various form factors of conductive preforms.

A known method for placing solder bumps on electronic pads on a substrate utilizes a stencil placed over the electronic pads on the substrate to guide solder paste to flow through openings in the stencil plate onto the electronic pads. The solder paste is typically spread over the stencil using a squeegee to evenly distribute the solder paste as well as remove the excess solder paste. After the stencil is removed from the substrate, solder bumps are formed on, and remain attached to, the electronic pads. This method technically forms the solder bumps on the electronic pads and does not place solder that has been preformed on the electronic pads.

The solder paste, as formed in this method, has a tendency to develop internal structural defects, such as voids, or variation of fused solder volumes during the fusing process, thereby introducing potential defects to the manufacturing process and/or risk of failure during the life of the product. This is an undesirable consequence of this method.

A first known method for placing solder balls on electronic pads on a substrate utilizes a stencil plate placed over the electronic pads on the substrate to guide solder balls to drop through openings in the stencil plate onto the electronic pads. The electronic pads having been pre-printed with solder paste, the solder balls then adhere to the electronic pads via the solder paste. During a reflow operation, the solder balls fuse to the electronic pads on the substrate.

Besides requiring a guiding force to reliably introduce the solder balls into the openings in the stencil plate, this method additionally suffers from a hot-air knife reflow heating step that unevenly distributes heat over the solder balls in the stencil plate. Further, the heating step applied while the solder balls are in the stencil may cause the solder to melt and adhere to the stencil. Furthermore, a heating-knife motion control mechanism can be expensive.

A second known method for placing solder balls on electronic pads on a substrate utilizes tubes to hold the solder balls over the electronic pads. Each tube applies a vacuum force to hold a solder ball to the end of the tube. After locating the tubes holding the solder balls over the electronic pads, the solder balls are placed on the electronic pads by removing the vacuum force from the tubes and vertically vibrating the tubes to release the solder balls onto the electronic pads.

The apparatus for this second method tends to be complicated and can be expensive to produce and maintain. Since the solder balls are placed sequentially, the process is not conducive to cycle time. It also may not be suitable for micro-BGA placement where the pitch of the pads is very fine and requires tight tolerances in locating the solder spheres.

A third known method for placing solder balls on electronic pads on a substrate utilizes a plate with solder bumps attached to the plate in a pattern corresponding to the pattern of the electronic pads on the substrate. The solder bumps are attached to the plate by etching a pattern of openings in a photoresist mask over the plate according to a predefined artwork, and then depositing solder composition on the plate at the openings (where the plate surface is exposed) by an electroplating operation. Lastly, after removing the photoresist layer, the solder bumps remain attached to plate. The solder bumps are then placed on the electronic pads on the substrate by positioning the plate over the electronic pads to allow the solder bumps to contact the electronic pads. By heating the entire assembly, the solder bumps melt and transfer onto the electronic pads.

Hertz (U.S. Pat. No. 6,202,918) teaches a solder sphere placement apparatus which utilizes an etched stencil to create a pattern for the solder spheres and a moving backing plate for releasing the solder spheres from the etched stencil. Hertz '918 is limited in the complexity of the placement head.

Hertz (U.S. Pat. Nos. 6,230,963 and 6,510,977) teaches a laminated foil design for the solder sphere placement apparatus, reducing the complexity of the solder sphere placement apparatus of Hertz '918. Hertz '963 is limited in the requirement for a custom backing plate for each solder sphere pattern. Additionally, the design taught by Hertz is limited in that the backing plate does not support the solder sphere at the apex of the solder sphere when placed into the pattern aperture.

Hertz (U.S. Pat. No. 6,412,685) teaches a plurality of release mechanisms. Included is a vibrational release mechanism, which provides a tapping release force.

Brown, et al (U.S. Pat. No. 5,205,896) teaches applying a tapping mechanism for aiding in the transfer of the solder spheres.

Besides constituting a relatively expensive process to implement in a mass production environment or use for occasional rework, this method requires trained operators to perform numerous steps, including chemical processing steps that can subject an operator to environmental hazards. The overall process, therefore, can be environmentally unfriendly, time consuming, expensive, and generally requiring trained operators to be effective.

The use of Ball Grid Array technology is increasing as the advantages of the interconnect process are recognized. The disadvantage of this technology is where rework or salvage of components using Ball Grid Array technology is required; once the component is removed a portion of the solder spheres remains on the component and a portion of the solder spheres remains on the Printed Circuit Board (PCB). Thus, what is necessary is a low cost and efficient method and apparatus for placing conductive spheres on pads on a component, or on a substrate.

While each of these improvements has contributed to the art, the art can be improved by the utilization of a new backing member design.

SUMMARY OF THE INVENTION

One aspect of the present invention is to provide a low cost tool for locating and placing the solder spheres onto the pads of substrates or components. The tool preferably comprises a foil structure that includes a plurality of openings that are used to locate, hold, and place the solder spheres onto the pads.

Another aspect of the present invention is the use of current state of the art technology, including artwork and a photo developing and etching process on the foil to create the openings. This process eliminates significant variation in locating and forming the openings in the foil while maintaining a low cost for the tool. As the distance between the centers of the pads (pitch) decreases, such as for fine pitch, or micro BGA (μBGA) manufacturing, the variation in locating and shaping the openings becomes significantly more critical for maintaining an accurate and reliable solder sphere placement process.

Another aspect of the present invention is the ability to facilitate changing a pattern of openings on a foil for placing solder spheres on different arrangements (patterns) of pads. By using different foils with different etched patterns (different patterns of openings etched in the foils), the low cost tool can efficiently place solder spheres on different patterns of pads on a substrate.

Another aspect of the present invention is the ability to utilize one aperture pattern and modify the placed pattern of solder spheres by filling or covering the undesirable apertures. The material partially covering the first foil aperture can increase the reliability of filler material located inside the undesired apertures of the foil.

Another aspect of the present invention is the ability to include a mechanism to hold the solder spheres at the openings in the foil and then remove the holding force to place the solder spheres on the pads.

Another aspect of the present invention is the ability to allow flow of a vacuum force to the apertures of the foil.

Another aspect of the present invention is the ability to utilize apertures to locate a pattern of solder spheres, in conjunction with a second feature which retains the solder spheres from entering the vacuum chamber. This aspect ensures release of the solder spheres. The feature that controls the distance that the solder spheres enter into the vacuum chamber comprising a backing member aperture having at least one rib member.

Yet, another aspect of the present invention is the utilization of a single rib member spanning across said backing member aperture.

Yet another aspect of the present invention is the utilization of a rib member spanning across said backing member aperture, said rib member having a width that is less than 50% of the diameter of the backing aperture and greater than 20% of the diameter of the backing aperture.

Yet another aspect of the present invention is the utilization of a rib member spanning across said backing member aperture, said rib member having a width that is approximate ¼ of the diameter of the backing aperture.

Yet another aspect of the present invention is the utilization of a rib member spanning across said backing member aperture, said rib member having a width that is approximate ⅓ of the diameter of the backing aperture.

Yet another aspect of the present invention is the utilization of a pair of rib members spanning across said backing member aperture, said rib members are placed at a right angle to each other.

Yet, another aspect of the present invention is a backing member aperture, said backing member aperture having a diameter that is equal to a diameter of a BGA pattern aperture.

Yet, another aspect of the present invention is a backing member aperture, said backing member aperture having a diameter that is larger than a diameter of a BGA pattern aperture.

Yet another aspect of the present invention is a backing member aperture plate, said backing member aperture plate fabricated utilizing a chemical etch process.

Yet another aspect of the present invention is a backing member aperture plate, said backing member aperture plate fabricated utilizing a laser etch process.

Yet another aspect of the present invention is a backing member aperture plate, said backing member aperture plate fabricated placing a generic pattern of backing apertures across said backing member aperture plate.

Yet another aspect of the present invention is a backing member aperture plate, said backing member aperture plate fabricated placing a generic pattern of backing apertures across said backing member aperture plate, placing an odd numbered pattern with a centered aperture registered to a center of the backing member aperture plate.

Yet another aspect of the present invention is a backing member aperture plate, said backing member aperture plate fabricated placing a generic pattern of backing apertures across said backing member aperture plate, placing an even numbered pattern with a non aperture center registered to a center of the backing member aperture plate.

Yet another aspect of the present invention is a backing member aperture plate, said backing member aperture plate fabricated placing a generic pattern of backing apertures across said backing member aperture plate, said generic pattern having a standard pitch (distance between two adjacent apertures).

Yet, another aspect of the present invention is a backing member aperture, said backing member aperture having a diameter that is smaller than a diameter of a BGA pattern aperture.

Yet, another aspect of the present invention is a flux application method.

Yet another aspect of the present invention is a flux application method, said flux application method comprising screen printing said flux onto said receiving pads of said component.

Yet another aspect of the present invention is a flux application method, said flux application method comprising dipping said pattern of solder spheres into a flux reservoir.

Yet another aspect of the present invention is a flux application method, said flux application method comprising dipping said pattern of solder spheres into a flux reservoir, said flux reservoir having a fixed depth of flux medium.

Yet, another aspect of the present invention is a vibrational release mechanism.

Yet, another aspect of the present invention is a vibrational release mechanism, said vibrational release mechanism comprising a vibrational energy source coupled to a cantilevered tapping mechanism.

Yet, another aspect of the present invention is a vibrational release mechanism, said vibrational release mechanism comprising at least one of an off balanced motor, a piezoelectric crystal, a mass resonant device, and the like.

Yet, another aspect of the present invention is a vibrational release mechanism, said vibrational release mechanism controlled by a foot pedal.

Yet, another aspect of the present invention is a vibrational release mechanism, a vacuum holding force and said vibrational release mechanism both controlled by a foot pedal.

Yet another aspect of the present invention is a vibrational release mechanism, said vacuum holding force and said vibrational release mechanism both controlled by a foot pedal, wherein when a user depresses said foot pedal, said vacuum holding force is removed and said vibrational release mechanism is activated.

Yet, another aspect of the present invention is the utilization of registration pins for alignment of both a flux applicator and a solder sphere placement apparatus to a component.

DETAILED DESCRIPTION OF THE INVENTION

Figure 1:
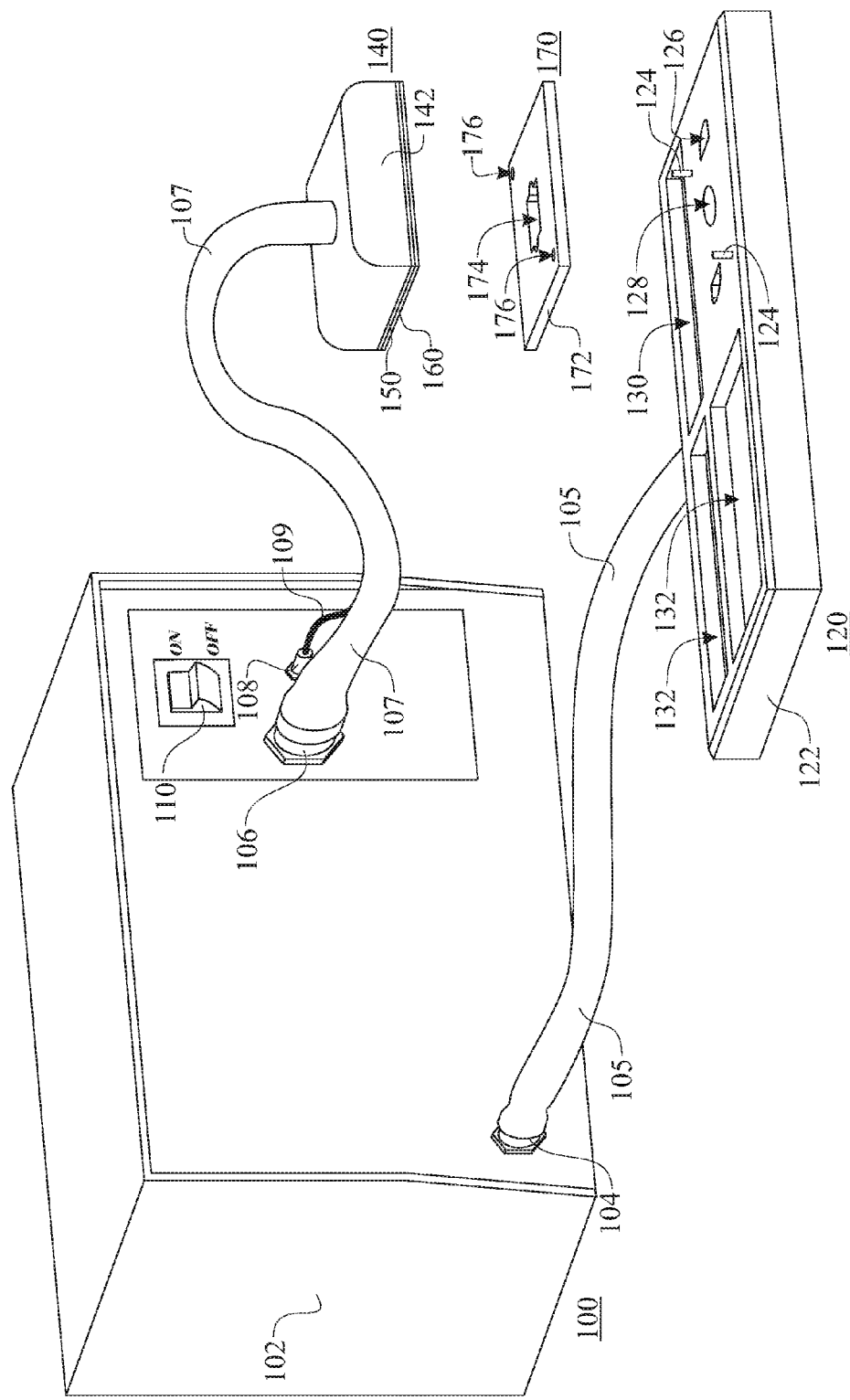
FIG. 1 is an isometric view of a solder sphere placement apparatus in an exemplary embodiment of the present invention.

FIG. 1 presents an isometric illustration of a complete solder sphere placement system, said system comprising a vacuum control center 100, a BGA placement workstation 120 and a solder sphere placement head assembly 140. Said vacuum control center 100 comprising a vacuum motor (not shown), an optional vacuum flow control valve, an optional control circuit board, and a main power switch 110. Said BGA placement workstation 120 comprising a BGA placement workstation baseplate 122, said BGA placement workstation baseplate 122 incorporating a solder sphere reservoir 130, at least one storage recess 132 and a component work area, said component work area comprising a pair of BGA alignment plate registration pins 124, a pair of finger clearance(s) 126, and a BGA placement workstation vacuum port 128. Said solder sphere placement head assembly 140 comprising a solder sphere placement head 142, and a lamination of a solder sphere placement backing plate 150 and a solder sphere pattern plate 160. Said vacuum control center 100 interfaces with the peripheral assemblies, specifically said BGA placement workstation 120 and said solder sphere placement head assembly 140 via a vacuum control-base workstation vacuum coupler 104, a vacuum control-placement head vacuum coupler 106 and a release mechanism control coupler 108. Said vacuum control-base workstation vacuum coupler 104 and a respective vacuum control-base workstation vacuum conduit 105 are used to transfer a vacuum force generated by said vacuum motor of said vacuum control center 100 to said BGA placement workstation 120. Said vacuum control-placement head vacuum coupler 106 and a respective vacuum control-placement head vacuum conduit 107 are used to transfer said vacuum force generated by said vacuum motor of said vacuum control center 100 to said solder sphere placement head assembly 140. A release mechanism control is provided via a release mechanism control cable 109, which is electro-mechanically coupled to said vacuum control center 100 via said release mechanism control coupler 108. It is recognized that a foot pedal can be interfaced with said optional control circuit board, wherein said control circuit board can be utilized to control the operation of said vacuum motor and release mechanism. One presented mode of operation is accomplished when said main power switch 110 is powered on, said vacuum motor applies a vacuum force to said BGA placement workstation 120 and said solder sphere placement head assembly 140. The user places an alignment plate 170 onto said BGA placement workstation 120 utilizing BGA alignment plate registration pins 124 of said BGA placement workstation 120 and alignment plate registration aperture(s) 176 machined into a alignment plate stock 172 to provide alignment of a component (shown later) to a placement pattern (shown later) of said solder sphere placement head assembly 140. The user places a component into a component registration aperture 174 of said alignment plate 170 with the solder sphere receiving side facing upwards. A component securing vacuum force is provided via a BGA placement workstation vacuum port 128 of said BGA placement workstation 120, said component securing vacuum force temporarily secures the component in location during placement of the solder spheres.

Figure 2:
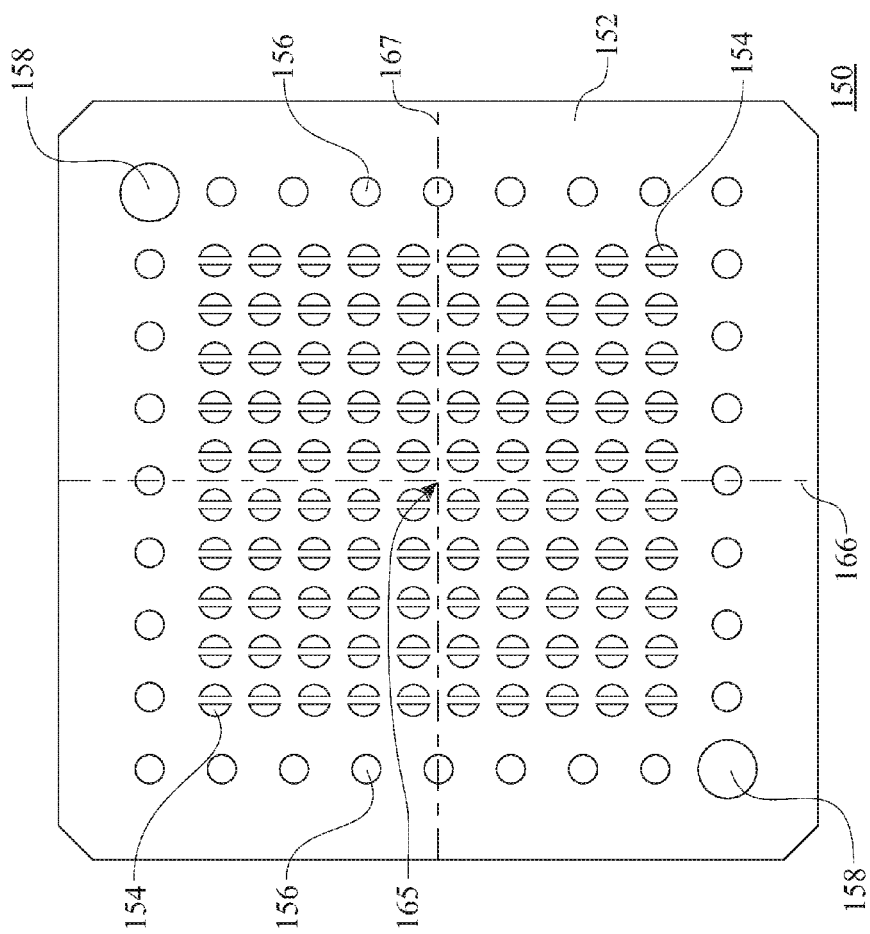
FIG. 2 is a top view of a solder sphere placement apparatus backing plate in accordance with a first pattern.
Figure 3:
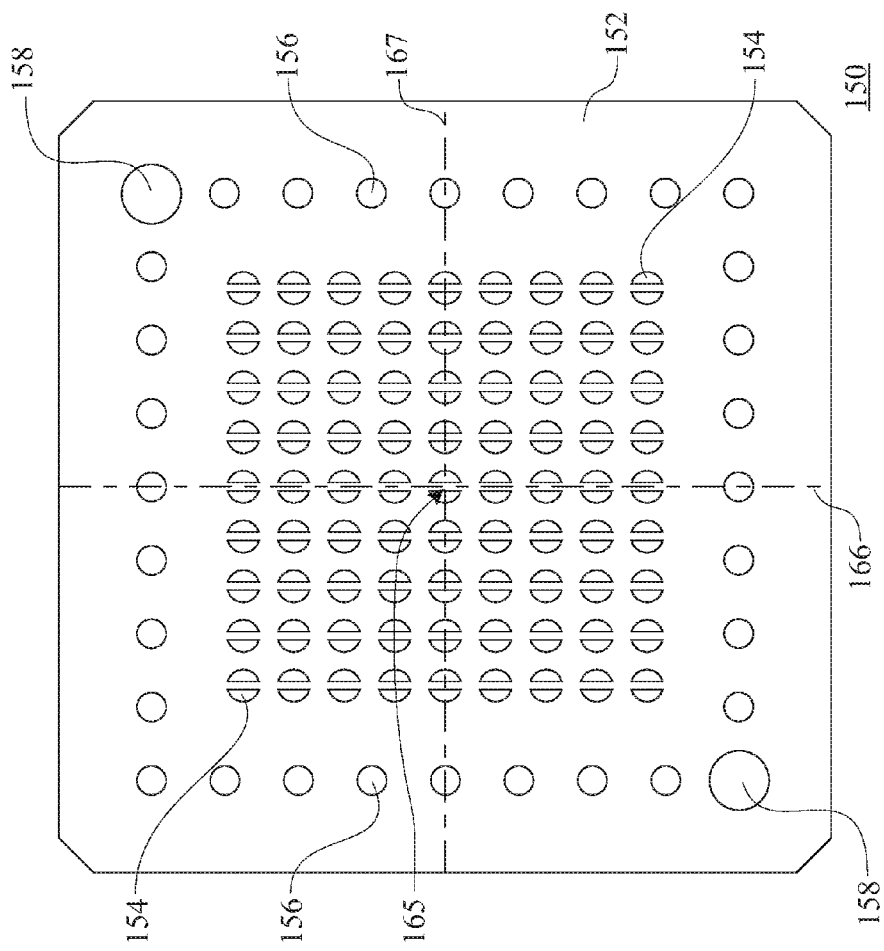
FIG. 3 is a top view of a solder sphere placement apparatus backing plate in accordance with an alternate pattern.

FIGS. 2 and 3 present two embodiments of said solder sphere placement backing plate 150. Said solder sphere placement backing plate 150 comprising a placement backing plate material 152, said placement backing plate material 152 is then processed via any known etching process to create a pair of registration aperture(s) 158, a plurality of adhesive enhancing aperture(s) 156 and a pattern of solder sphere backing aperture pattern 154. One such process would be laser etching. Alternately, chemical etching can be used, as the dimensions of said solder sphere backing aperture pattern 154 are not as critical as placement pattern apertures (shown later). FIG. 2 presents a pattern comprising an even number of said solder sphere backing aperture pattern(s) 154 in each of a horizontal (row) and vertical (column) directions. The even numbered pattern is oriented with a center of the pattern (lacking an aperture) aligned to a plate center 165, said plate center 165 is a center of each of a vertical centerline 166 and a horizontal centerline 167. FIG. 3 presents a pattern comprising an odd number of said solder sphere backing aperture pattern(s) 154 in each of a horizontal and vertical directions. The odd numbered pattern is oriented with a center of the pattern (center aperture) aligned to said plate center 165. Each pattern would be of an industry standard pitch. Examples are 50 mm, 40 mm, 30 mm, and the like. It is desirable that the pattern of said solder sphere backing aperture pattern 154 is complete, wherein said complete pattern is defined as apertures in every grid of an array. This provides a standard set of said solder sphere placement backing plate 150 that can be used within a large variety of desired placement patterns in an easy and economic manner. Details of said solder sphere backing aperture pattern 154 will be described later herein. A plurality of said adhesive enhancing aperture(s) 156 are incorporated about a perimeter of said pattern of said solder sphere backing aperture pattern 154 to provide an increase in adhesion between said solder sphere placement backing plate 150 and said solder sphere pattern plate 160.

Figure 4:
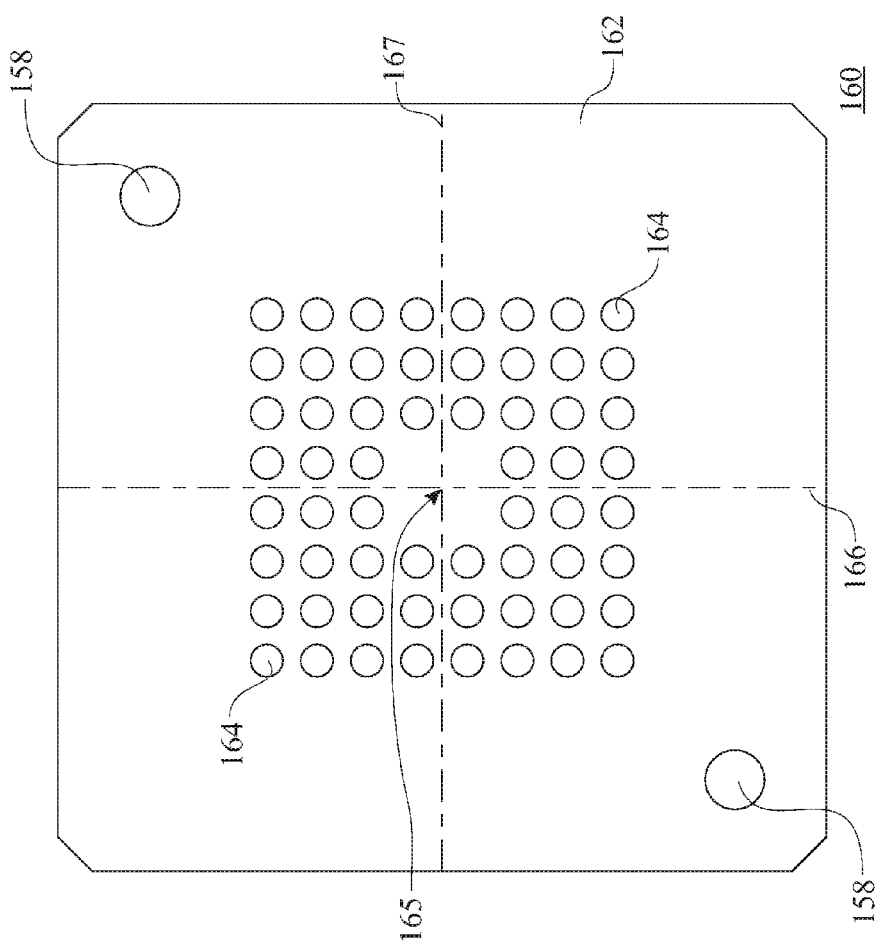
FIG. 4 is a top view of a solder sphere placement apparatus pattern plate in accordance with an exemplary pattern.

FIG. 4 presents an exemplary embodiment of said solder sphere pattern plate 160 illustrating a pattern of BGA pattern aperture(s) 164 etched into a BGA pattern plate material 162. The presented pattern illustrates several features of the present invention. The first is the use of a generic version of said solder sphere placement backing plate 150. Said solder sphere placement backing plate 150 of FIG. 2 comprising an array of said solder sphere backing aperture pattern 154, said array being ten (10) horizontally and ten (10) vertically. Said solder sphere pattern plate 160 presented comprising an array of said BGA pattern aperture(s) 164, said array being eight (8) horizontally and eight (8) vertically, and more so, omitting the four (4) center apertures. It is recognized that any pattern can be created within said BGA pattern plate material 162 and if said pattern is of a standard pitch, a generic solder sphere placement backing plate 150 can be utilized. Said solder sphere pattern plate 160 as presented would be laminated to said solder sphere placement backing plate 150 as presented in FIG. 2 herein.

Figure 6:
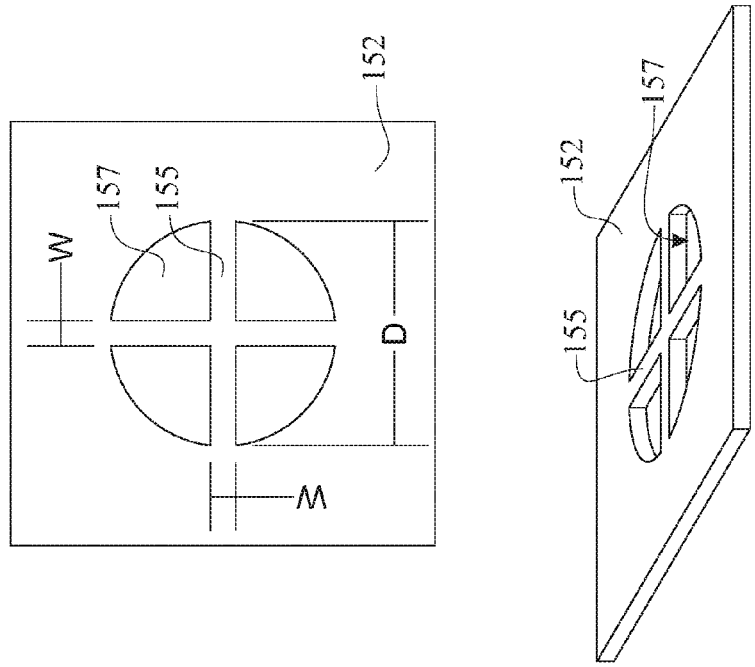
FIG. 6 is a top and respective isometric view of an alternate exemplary embodiment of solder sphere backing aperture.
Figure 5:
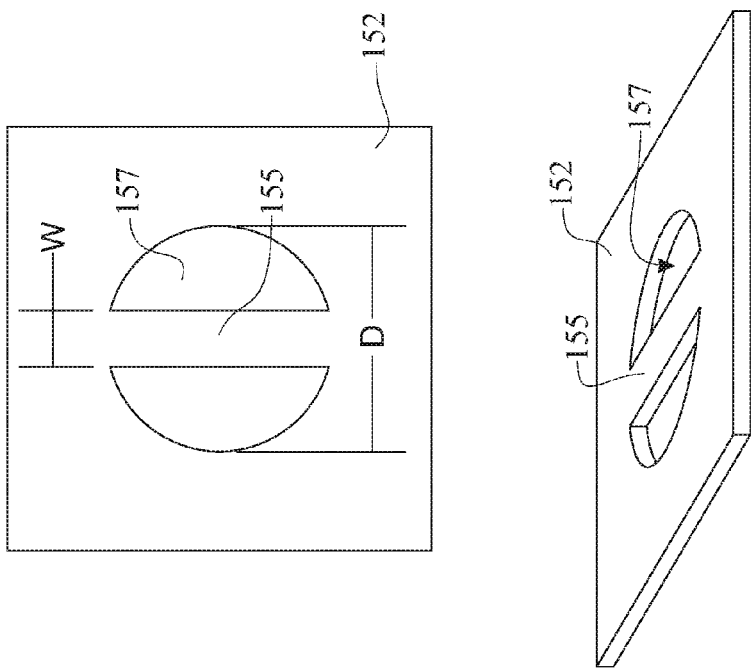
FIG. 5 is a top and respective isometric view of an exemplary embodiment of solder sphere backing aperture.

FIGS. 5 and 6 present two preferred versions of said solder sphere backing aperture pattern 154. FIG. 5 presents a solder sphere backing aperture pattern 154 comprising a single sphere backing rib 155, which creates a pair of backing airflow aperture(s) 157. Said sphere backing rib 155 is unique over the prior art in that said sphere backing rib 155 provides a backing for containing said solder sphere within said BGA pattern aperture(s) 164, wherein the backing is centered about the sphere. FIG. 6 presents a solder sphere backing aperture pattern 154 comprising a pair of sphere backing ribs 155 arranged at right angles to each other, which creates four (4) separate backing airflow aperture(s) 157. Said sphere backing rib 155 can be dimensioned as a ratio to a solder sphere backing aperture diameter D. Said sphere backing rib 155 is dimensioned by a solder sphere backing rib width W. The desirable ratio presents a W:D ratio wherein said W is generally ¼ to ⅓ of D; slightly smaller for a pair of said sphere backing rib 155. Solder sphere backing aperture diameter D can be of any reasonable size, with the preferred dimension being slightly larger than the typical diameter of said BGA pattern aperture(s) 164.

Figure 7:
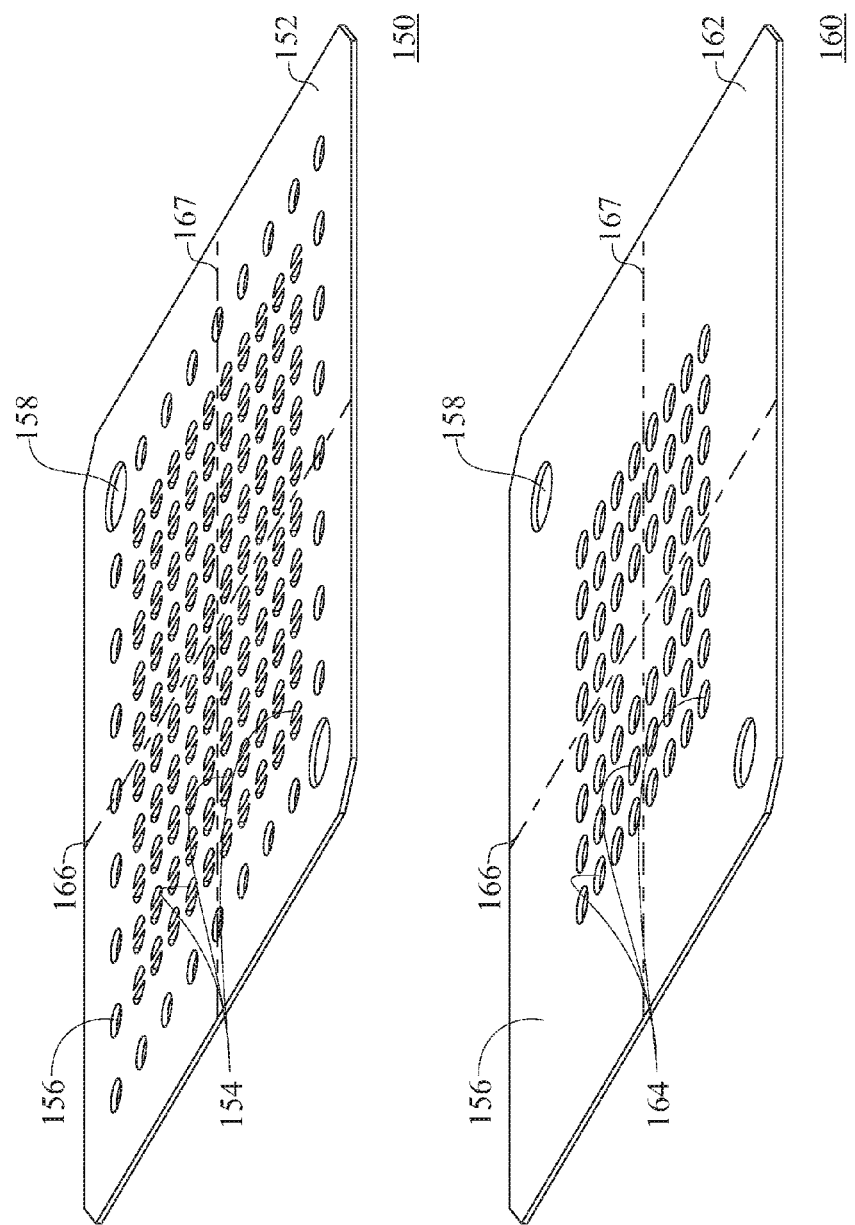
FIG. 7 is a detailed isometric illustration presenting a solder sphere pattern plate and a solder sphere placement backing plate.

FIG. 7 illustrates an assembly relation between said solder sphere placement backing plate 150 and said solder sphere pattern plate 160. The pair of said registration aperture(s) 158 can be utilized for registration of said solder sphere placement backing plate 150 and solder sphere pattern plate 160 to each other. Any said solder sphere backing aperture pattern 154 which are not paired to a BGA pattern aperture(s) 164 as well as all said adhesive enhancing aperture(s) 156 are utilized to provide additional mechanical support for adhesion between said solder sphere placement backing plate 150 and said solder sphere pattern plate 160. The pattern of said BGA pattern aperture(s) 164 limits the vacuum flow and resulting pattern generation of said solder spheres to only those BGA pattern aperture(s) 164 incorporated into said solder sphere pattern plate 160. Any apertures of solder sphere placement backing plate 150 not paired with a BGA pattern aperture(s) 164 are sealed by the remaining said BGA pattern plate material 162.

Figure 8:
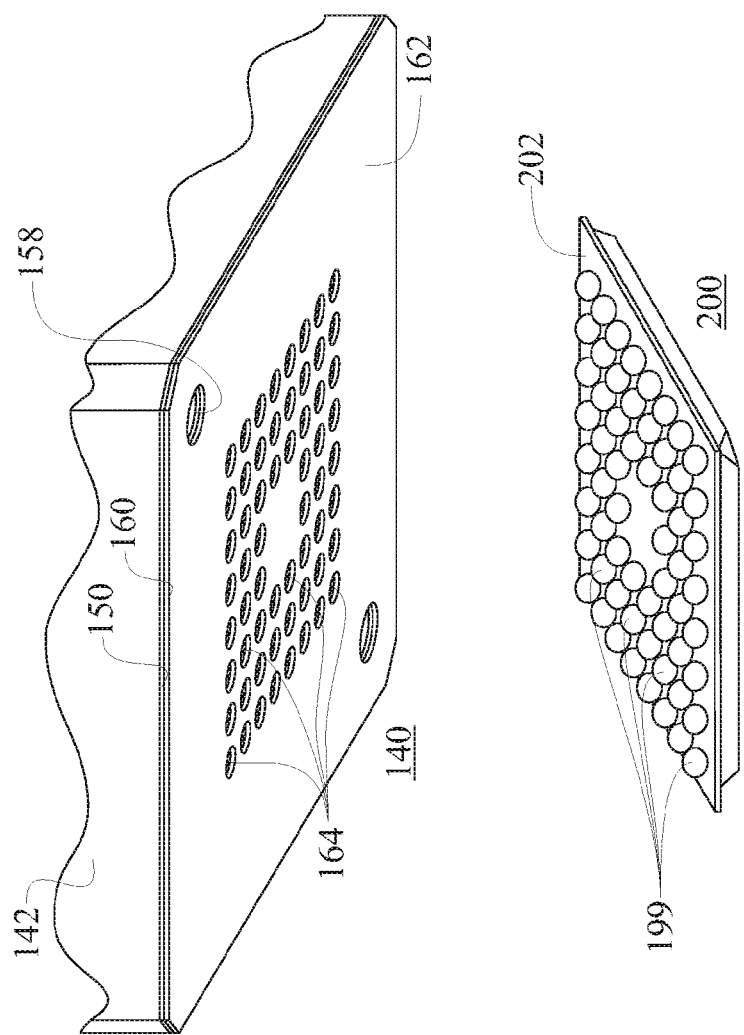
FIG. 8 is an isometric illustration presenting the relation between the solder sphere placement apparatus and a Ball Grid Array (BGA) component.

FIG. 8 presents an isometric illustration of the pattern and laminated assembly of FIG. 7 in relation to a respective Ball Grid Array (BGA) component 200. Said Ball Grid Array (BGA) component 200 comprising a pattern of solder sphere(s) 199 placed onto a solder sphere receiving substrate 202. One can note the laminated foils solder sphere placement backing plate 150 and said solder sphere pattern plate 160 only provide a vacuum holding force respective to the pattern of said solder sphere pattern aperture(s) 164 of solder sphere pattern plate 160. Said pattern of solder sphere pattern aperture(s) 164 can be a subset of said pattern of solder sphere backing aperture pattern 154. Said subset can be defined where all of said solder sphere pattern aperture(s) 164 have a respective solder sphere backing aperture pattern 154, but wherein not all of said solder sphere backing aperture pattern 154 have a respective solder sphere pattern aperture(s) 164.

Figure 9:
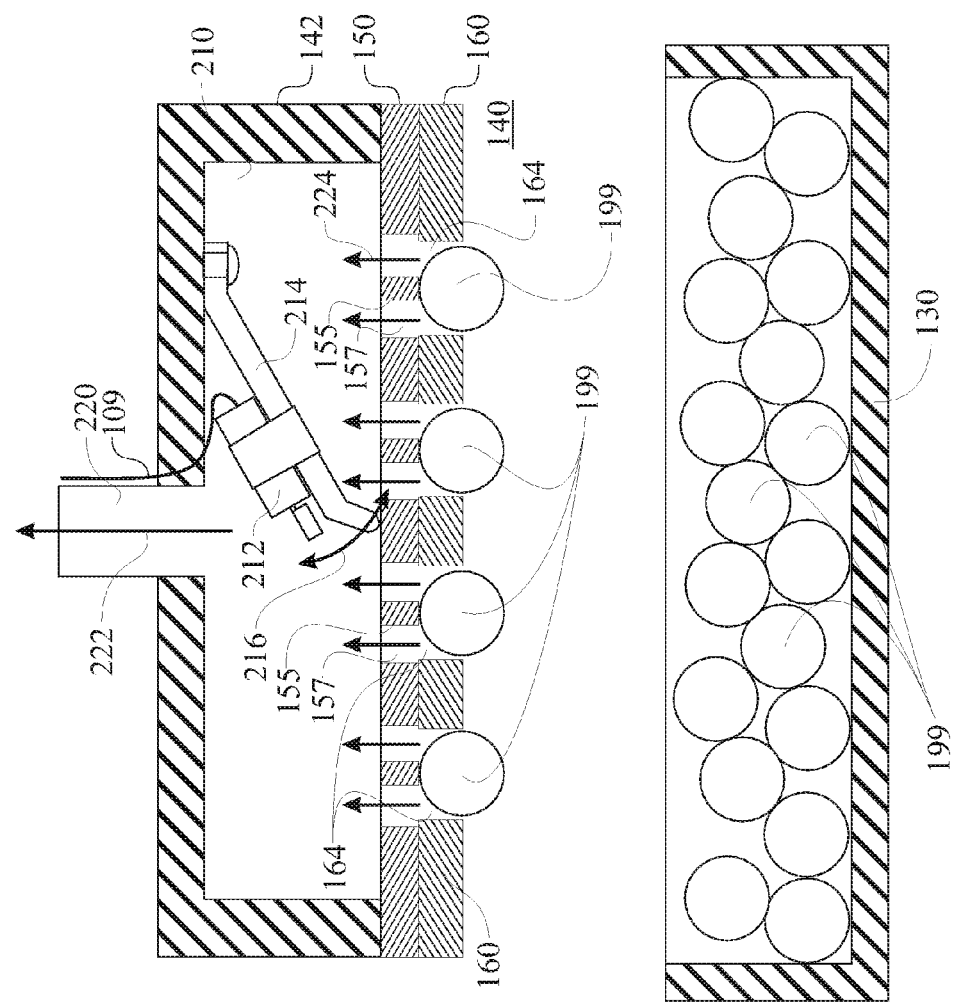
FIG. 9 is an elevation view illustrating a cross sectional view of a solder sphere placement apparatus during the process of creating a solder sphere placement pattern.

FIG. 9 presents a cross-sectional view of said solder sphere placement head assembly 140 illustrating details of the pattern generation process. A primary vacuum flow 222 is provided via a placement head vacuum conduit 220 and distributed within said solder sphere placement head 142 via a placement head vacuum chamber 210. The desired vacuum is one having a continuous flow, as opposed to a suction vacuum, which generates a low pressure. The vacuum flow pulls air through said solder sphere pattern aperture(s) 164 and continuing through said backing airflow aperture(s) 157 into said placement head vacuum chamber 210. As the air flows, it pulls a solder sphere(s) 199 from said solder sphere reservoir 130 and towards/into said solder sphere pattern aperture(s) 164 and once said solder sphere(s) 199 is seated within said solder sphere pattern aperture(s) 164 and against said sphere backing rib 155, it remains held in position via a solder sphere vacuum flow holding force 224. The illustration presents said solder sphere pattern aperture(s) 164 having a diameter that is slightly smaller than the diameter D of said solder sphere backing aperture pattern 154. By placing said sphere backing rib 155 centered within said solder sphere pattern aperture(s) 164, the geometry ensures that said solder sphere(s) 199 will be seated in the center of said solder sphere pattern aperture(s) 164. A release mechanism is presented, said release mechanism comprising a vibrating mechanism 212 mounted upon a vibrating member cantilever 214, said vibrating member cantilever 214 is then coupled to an interior wall of said solder sphere placement head 142 within said placement head vacuum chamber 210. Said vibrating mechanism 212 is operated via power provided through a release mechanism control cable 109. As said vibrating mechanism 212 is activated, said vibrating mechanism 212 creates vibrational energy, wherein said vibrational energy causes said vibrating member cantilever 214 to oscillate in a vibrating motion 216 as illustrated. Said vibrating motion 216 provides a tapping force applied to an inner surface of said solder sphere placement backing plate 150.

Figure 10:
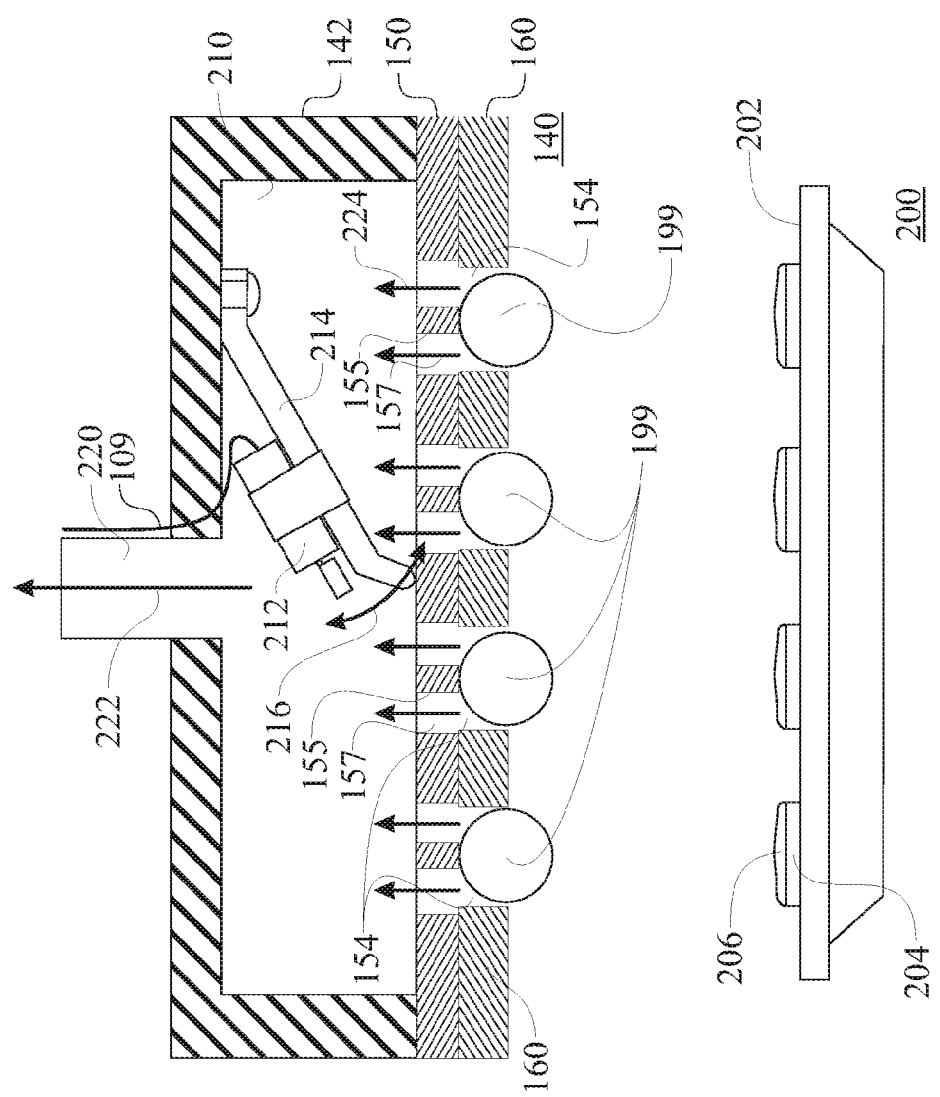
FIG. 10 is an elevation view illustrating a cross sectional view of a solder sphere placement apparatus during the process of placing said solder sphere placement pattern onto a receiving component.

The tapping force ensures release and transfer of said solder sphere(s) 199 from said solder sphere pattern aperture(s) 164 onto said solder sphere receiving pad(s) 204 as illustrated in FIG. 10. A tacky media/flux 206 is applied to either said solder sphere receiving pad(s) 204 or onto said solder sphere (s) 199 (not shown), wherein said tacky media/flux 206 provides several ingredients for the process. The first being temporarily holding said solder sphere(s) 199 to said solder sphere receiving pad(s) 204. The second being a cleaning process to provide a reliable interconnection between said solder sphere(s) 199 and said solder sphere receiving pad(s) 204 during a reflow process.

Figure 11:
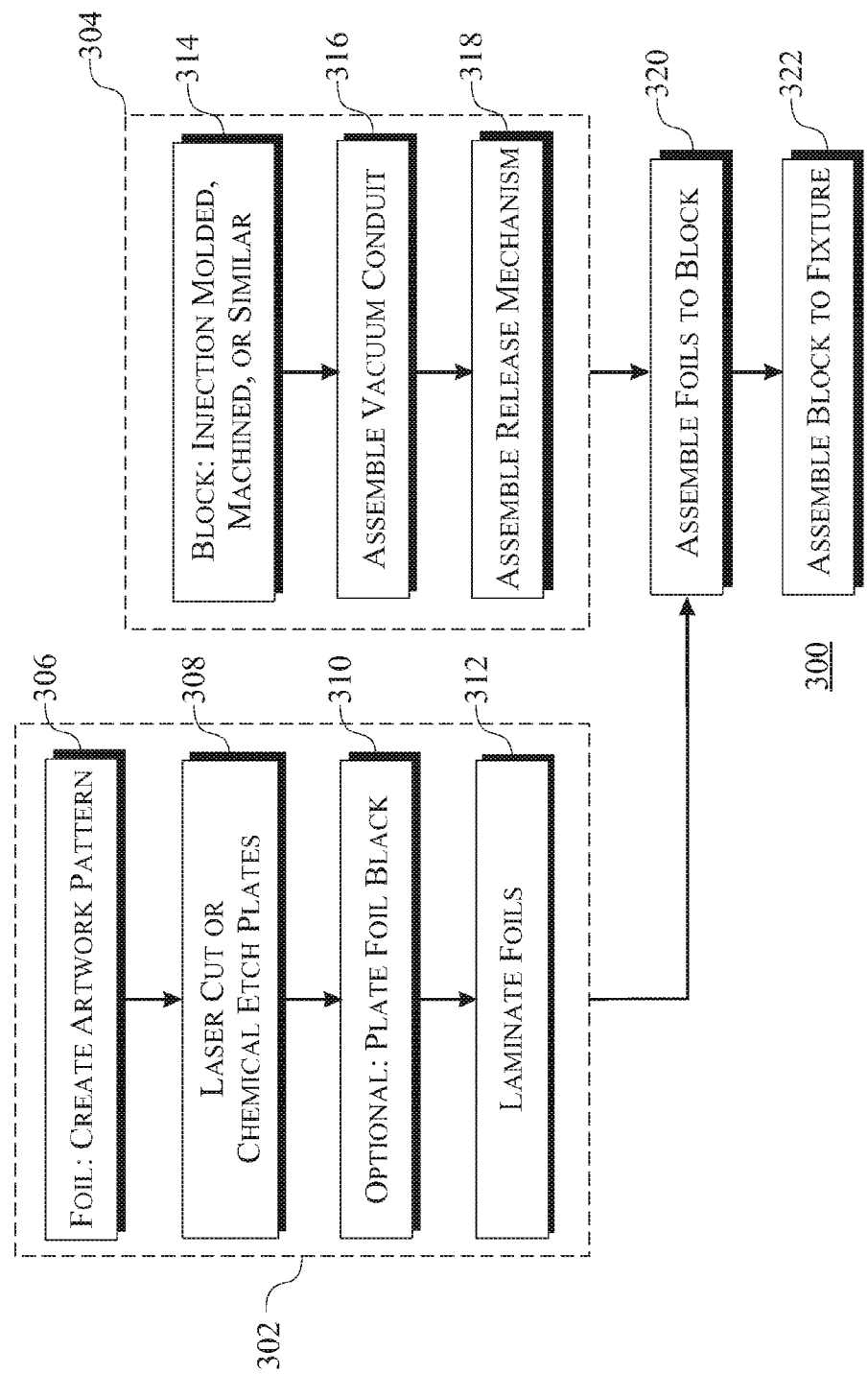
FIG. 11 presents a solder sphere placement apparatus manufacturing flow diagram.

FIG. 11 presents a placement head fabrication flow diagram 300, said placement head fabrication flow diagram 300 comprising primary steps of a placement foil fabrication steps 302 and a placement head fabrication steps 304. Said placement foil fabrication steps 302 initiates with a designer creating a pattern for each of said solder sphere placement backing plate 150 and solder sphere pattern plate 160 in accordance with a pattern artwork creation step 306. The pattern artwork for said solder sphere placement backing plate 150 would be provided in accordance with the details provided in FIGS. 2, 3, 5, and 6. The pattern artwork for said solder sphere pattern plate 160 would be provided in accordance with the details provided in FIG. 4. The stencil fabricator then utilizing an etching process to fabricate said solder sphere placement backing plate 150 and said solder sphere pattern plate 160 from a sheet of raw material in accordance with a stencil etching step 308. The raw material would be of stainless steel, brass, copper, and the like. The thickness would be respective to the diameter D of said solder sphere(s) 199. One design utilizes a BGA pattern plate material 162 having a thickness of approximately ½ to ⅔ of the diameter of said solder sphere(s) 199. Any known etching process can be utilized, including laser etching (accurate), chemical etching (slightly less accurate), and the like. Since said solder sphere(s) 199 are generally shiny silver in color and said BGA pattern plate material 162 is generally shiny and silver (assuming stainless steel is used), it is difficult to inspect the completeness of the pattern of said solder sphere(s) 199 placed within said solder sphere pattern plate 160. To improve the inspection process, an optional foil-colorizing step 310 can be utilized. A number of methods are known for colorizing foils, including that taught by Hertz '963. The pair of foils, said solder sphere placement backing plate 150 and said solder sphere pattern plate 160 are laminated in accordance with a foil lamination step 312. In the preferred scenario, the manufacturer would store a quantity of the two versions of said solder sphere placement backing plate 150 in standard pitches and custom fabricate a solder sphere pattern plate 160 in accordance with the desired component solder sphere pattern. Said solder sphere pattern plate 160 is placed with said registration aperture(s) 158 onto registration pins of an alignment jig with the lamination side facing upwards. Adhesive is carefully applied to the lamination side of said solder sphere pattern plate 160 ensuring that adhesive will not encroach into said solder sphere pattern aperture(s) 164. Said solder sphere placement backing plate 150 is then placed with said registration aperture(s) 158 onto said registration pins of said alignment jig with the lamination side facing down. A compression force is then applied to the laminated foils. Said placement head fabrication steps 304 is accomplished in a separate process flow and once completed, said solder sphere placement head assembly 140 is inventoried. Said placement head fabrication steps 304 initiates with a block fabrication step 314, wherein said solder sphere placement head 142 is fabricated via a machining process, a molding process, and the like. A vacuum conduit coupling member (not shown but well understood) is then assembled to said solder sphere placement head 142 in accordance with an assemble vacuum conduit step 316. Additionally, said vacuum control-placement head vacuum conduit 107 is coupled to said vacuum conduit coupling member of said solder sphere placement head 142. A base member coupling member can optionally be installed to the opposing end of said vacuum control-placement head vacuum conduit 107 providing a removable coupling means for coupling said vacuum control-placement head vacuum conduit 107 and said vacuum control-placement head vacuum coupler 106. An optional release mechanism is then fabricated and installed in accordance with a release mechanism assembly step 318. In the preferred embodiment, said vibrating member cantilever 214 is fabricated. A vibrating mechanism 212 is then secured to said vibrating member cantilever 214. Said release mechanism control cable 109 is then fed through a small opening within said solder sphere placement head 142 and electro-mechanically coupled to said vibrating mechanism 212. The completed assembly is installed and secured to the inside wall of said solder sphere placement head 142. Said release mechanism control cable 109 comprising an electro-mechanical coupling member for coupling said release mechanism control cable 109 and said release mechanism control coupler 108. The subassembly is then stored until an order arrives and a custom solder sphere pattern plate 160 is fabricated. An order arrives and the fabrication of said laminated foil assembly is completed. Said laminated foil assembly is adhesively secured to said solder sphere placement head 142 in accordance with an assemble foils to block step 320. Said solder sphere placement head assembly 140 is coupled to said vacuum control center 100 via said vacuum control-placement head vacuum coupler 106 and said release mechanism control coupler 108.

Said BGA placement workstation 120 is machined and said BGA alignment plate registration pins 124 are inserted in accordance with the preferred design. A workstation vacuum conduit is formed by drilling a horizontal hole from the rear wall of said BGA placement workstation baseplate 122 towards and under said BGA placement workstation vacuum port 128. Said BGA placement workstation vacuum port 128 is formed by drilling a vertical hole connecting with the horizontal hole. A connector can be assembled by threading the rear opening of the workstation vacuum conduit and inserting said connector.

Said vacuum control center 100 is formed via two pieces of sheet metal. The various components (vacuum motor, circuit board, etc.) are mounted in accordance with the selected components. A power cable and optional foot pedal are assembled. Vacuum plumbing and respective connectors are then installed. The optional release mechanism controlled is then wired and installed.

Said alignment plate 170 and flux solder stencil (not shown) are then fabricated via a machining and/or etching processes. Each is fabricated respective to a specific component design, comprising said component registration aperture 174 and a pair of said alignment plate registration aperture(s) 176 machined into an alignment plate stock 172.

Figure 12:
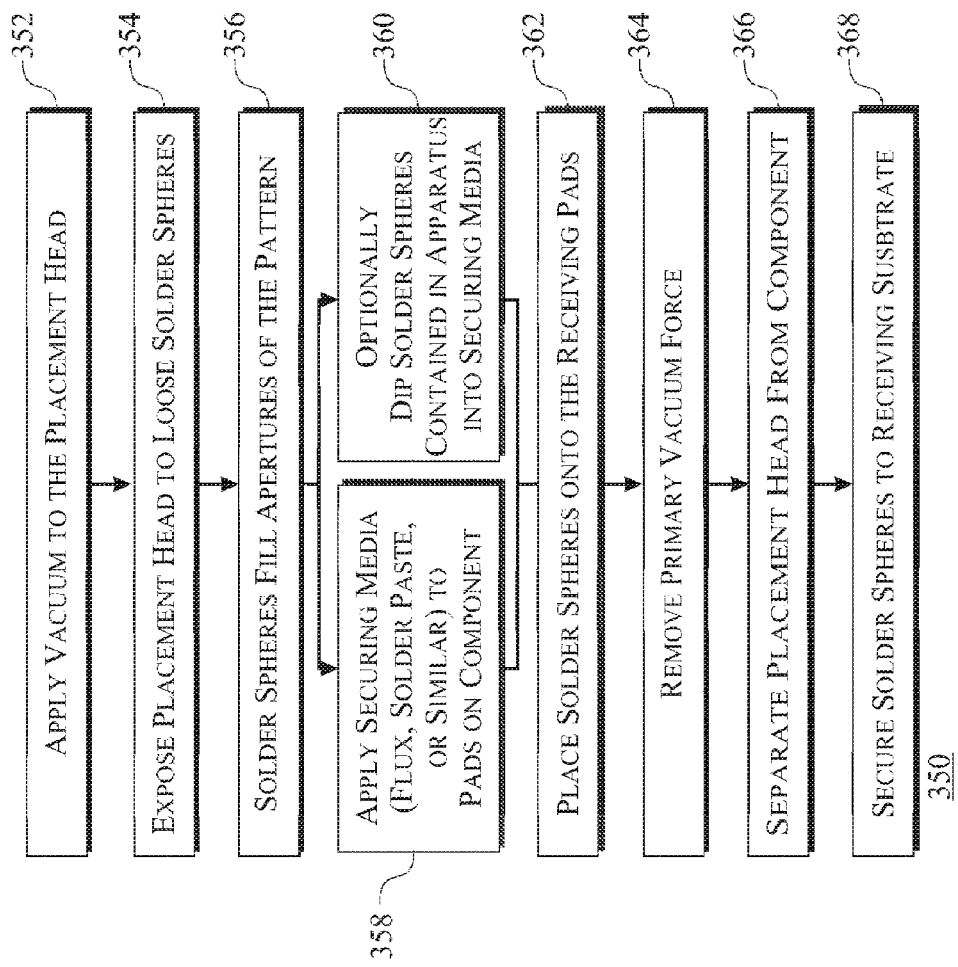
FIG. 12 presents a solder sphere placement pattern creation and placement flow diagram.

FIG. 12 presents a solder sphere placement process flow diagram 350, said solder sphere placement process flow diagram 350 comprising steps for creating a pattern of said solder sphere(s) 199 and transferring said pattern of said solder sphere(s) 199 onto a pattern of solder sphere receiving pad(s) 204. Said solder sphere placement process flow diagram 350 initiates with a placement head vacuum application step 352, wherein the user would apply power to the system which activates the vacuum motor. The vacuum motor creates and transfers a vacuum force to said solder sphere placement head assembly 140. Once vacuum is applied to said solder sphere placement head assembly 140, the user places said solder sphere placement head assembly 140 into said solder sphere reservoir 130, sliding said solder sphere placement head assembly 140 back and forth in accordance with an expose placement head to solder spheres step 354. The result is a solder sphere pattern generation step 356, wherein said solder sphere(s) 199 create a pattern by filling each of the plurality of said solder sphere pattern aperture(s) 164. In parallel, the user would place said alignment plate 170 onto said BGA placement workstation 120, being aligned via alignment plate registration aperture(s) 176 and said BGA alignment plate registration pins 124. The user then places said Ball Grid Array (BGA) component 200 into said component registration aperture 174 of said alignment plate 170. Said alignment plate 170 provide a means for registering said Ball Grid Array (BGA) component 200 to the pattern of said solder sphere pattern aperture(s) 164 of said solder sphere placement head assembly 140. A tacky media is then applied either directly to said solder sphere receiving pad(s) 204 of said Ball Grid Array (BGA) component 200 as presented in an application of tacky media to receiving pads step 358 or said tacky media is applied to the contact region of said solder sphere(s) 199 via dipping said pattern of said solder sphere(s) 199 into a vat of tacky media in accordance application of tacky media to solder spheres step 360. Tacky media can be applied by using a thin stencil (such as a 0.003" thick stencil material), wherein said stencil is fastened to a frame and aligned to said Ball Grid Array (BGA) component 200 via said BGA alignment plate registration pins 124. Said Ball Grid Array (BGA) component 200 is held in place via an applied vacuum force, provided via said vacuum control-base workstation vacuum conduit 105. Once said tacky media is in place, the pattern of said solder sphere(s) 199 are transferred to said solder sphere receiving pad(s) 204 in accordance with a solder sphere application step 362. The pattern of said solder sphere(s) 199 is aligned via placing said registration aperture (s) 158 onto said BGA alignment plate registration pins 124. The pattern of said solder sphere(s) 199 are released from said solder sphere placement head assembly 140 via the removal of said primary vacuum flow 222 as provided by a removal of the holding vacuum force step 364. Once said primary vacuum flow 222 is removed, the user can separate said solder sphere placement head assembly 140 from said Ball Grid Array (BGA) component 200 in accordance with a placement head component separation step 366. The result is a pattern of said solder sphere(s) 199 left onto said solder sphere receiving pad(s) 204 of said Ball Grid Array (BGA) component 200. The pattern of said solder sphere(s) 199 is permanently secured to said Ball Grid Array (BGA) component 200 via a reflow or curing step 368, wherein the placed pattern of said solder sphere(s) 199 are heated to liquefy said solder sphere (s) 199 which creates an electro-mechanical connection between said solder sphere(s) 199 and said solder sphere receiving pad(s) 204.

Figure 13:
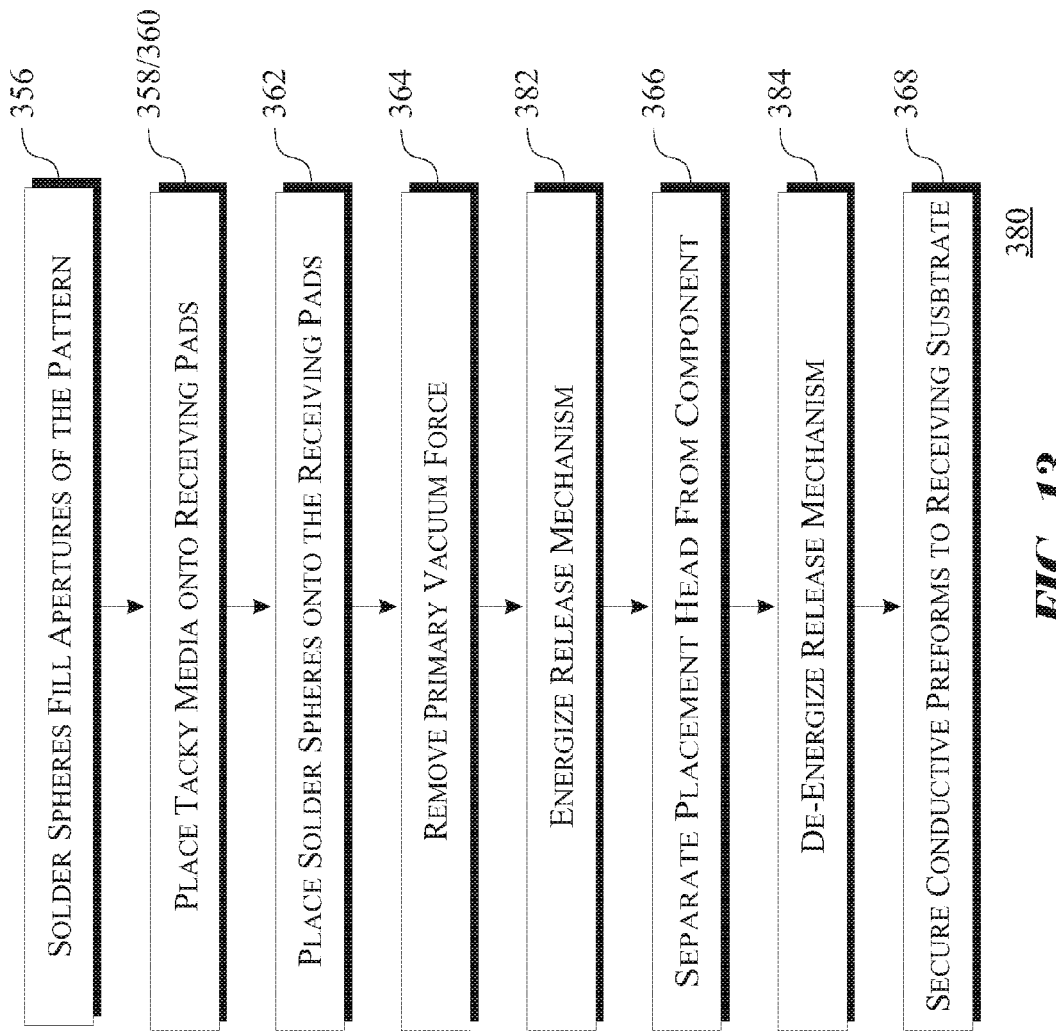
FIG. 13 presents a solder sphere placement pattern placement flow diagram further utilizing a release mechanism.

FIG. 13 presents a solder sphere release mechanism flow diagram 380, said solder sphere release mechanism flow diagram 380 presenting the steps of utilizing a releasing mechanism for assisting in the transfer of the pattern of said solder sphere(s) 199 onto said solder sphere receiving pad(s) 204 of said Ball Grid Array (BGA) component 200. Said solder sphere release mechanism flow diagram 380 comprising the same steps of said solder sphere placement process flow diagram 350, with the additional steps of energizing the release mechanism step 382 and de-energizing said release mechanism step 384. Said energizing the release mechanism step 382 is provided after removing said vacuum holding force, which can be jointly provided by depressing a foot pedal. The depressing of the foot pedal would activate a solenoid, which removes the vacuum force from said solder sphere placement head assembly 140 and energizes said vibrating mechanism 212. The user then separates said solder sphere placement head assembly 140 from said Ball Grid Array (BGA) component 200. Once separated, the user then accomplishes said de-energizing said release mechanism step 384 by releasing pressure applied to the foot pedal.

Various changes may be made to the embodiment shown herein without departing from the spirit and scope of the present invention.

What is claimed:

1. A solder sphere placement apparatus, said placement apparatus comprising:
    a solder sphere pattern plate fabricated of a foil having a thickness less than a diameter of a solder sphere contacting the solder sphere pattern plate, said solder sphere pattern plate comprising a plurality of pattern apertures;
    a solder sphere placement backing plate, said solder sphere placement backing plate comprising a plurality of solder sphere backing aperture patterns;
    wherein said solder sphere backing aperture patterns comprise a solder sphere backing aperture with at least one solder sphere backing rib spanning across said backing aperture pattern creating a plurality of backing airflow apertures;
    a solder sphere placement head comprising a vacuum conduit located through said placement head and a vacuum chamber for disbursing vacuum about a pattern of placement apertures; and
    said solder sphere pattern plate is laminated to said solder sphere placement backing plate and the laminated plates are fastened to said solder sphere placement head.

2. The solder sphere placement apparatus of claim 1, said solder sphere pattern plate further comprising at least one registration aperture,
    said solder sphere placement backing plate further comprising at least one registration aperture, and
    said solder sphere placement head further comprising at least one registration aperture.

3. The solder sphere placement apparatus of claim 1, wherein said plurality of backing aperture patterns is provided in an array having an even number of rows and an even number of columns and said array is centered within said solder sphere placement backing plate.

4. The solder sphere placement apparatus of claim 1, wherein said plurality of backing aperture patterns is provided in an array having an odd number of rows and an odd number of columns and said array is centered within said solder sphere placement backing plate.

5. The solder sphere placement apparatus of claim 1, said solder sphere placement backing plate further comprising a plurality of adhesive enhancing apertures.

6. The solder sphere placement apparatus of claim 1, wherein said at least one sphere backing rib comprising a width less than 50% of a diameter of said backing aperture pattern and greater than 20% of said diameter of said backing aperture pattern.

7. The solder sphere placement apparatus of claim 1, wherein said plurality of pattern apertures of said solder sphere pattern plate are a subset of said plurality of backing aperture patterns of said solder sphere placement backing plate.

8. A solder sphere placement apparatus, said placement apparatus comprising:
    a solder sphere pattern plate fabricated of a foil having a thickness less than a diameter of a solder sphere contacting the solder sphere pattern plate, said solder sphere pattern plate comprising a plurality of pattern apertures;
    a solder sphere placement backing plate, said solder sphere placement backing plate comprising a plurality of solder sphere backing aperture patterns;
    wherein said backing aperture patterns comprise a solder sphere backing aperture with at least one solder sphere backing rib spanning across said solder sphere backing aperture pattern creating a plurality of backing airflow apertures;
    a solder sphere placement head comprising a vacuum conduit located through said placement head and a vacuum chamber for disbursing vacuum about a pattern of placement apertures;
    said solder sphere pattern plate is laminated to said solder sphere placement backing plate and the laminated plates are fastened to said solder sphere placement head; and a release mechanism located within said vacuum chamber of said solder sphere placement head.

9. The solder sphere placement apparatus of claim 8, said release mechanism further comprising a vibrational energy source.

10. The solder sphere placement apparatus of claim 8, said release mechanism further comprising a vibrational mechanism, said vibrational mechanism coupled to a vibrating member cantilever, wherein when said vibrational mechanism is activated, said vibrating member cantilever applies a tapping force to said solder sphere placement backing plate.

11. The solder sphere placement apparatus of claim 8, wherein said plurality of backing aperture patterns is provided in a complete array wherein said array is centered within said solder sphere placement backing plate.

12. The solder sphere placement apparatus of claim 8, said solder sphere placement backing plate further comprising a plurality of adhesive enhancing apertures.

13. The solder sphere placement apparatus of claim 8, wherein said at least one sphere backing rib comprising a width less than 50% of a diameter of said backing aperture pattern and greater than 20% of said diameter of said backing aperture pattern.

14. The solder sphere placement apparatus of claim 8, wherein said plurality of pattern apertures of said solder sphere pattern plate are a subset of said plurality of backing aperture patterns of said solder sphere placement backing plate.

15. A solder sphere placement apparatus, said placement apparatus comprising:
a solder sphere pattern plate fabricated of a foil having a thickness less than a diameter of a solder sphere contacting the solder sphere pattern plate, said solder sphere pattern plate comprising a plurality of solder sphere pattern apertures;
a solder sphere placement backing plate, said solder sphere placement backing plate comprising a plurality of backing aperture patterns;
wherein said backing aperture patterns comprise a backing aperture with at least one sphere backing rib spanning across said backing aperture pattern creating a plurality of backing airflow apertures;
said at least one sphere backing rib having a backing rib width, wherein said backing rib width is at least 20% of a diameter of said solder sphere pattern apertures;
a solder sphere placement head comprising a vacuum conduit located through said placement head and a vacuum chamber for disbursing vacuum about a pattern of placement apertures; and
said solder sphere pattern plate is laminated to said solder sphere placement backing plate and the laminated plates are fastened to said solder sphere placement head.

16. The solder sphere placement apparatus of claim 15, said solder sphere backing aperture pattern comprising one sphere backing rib, said one sphere backing rib located proximate a center of said backing aperture.

17. The solder sphere placement apparatus of claim 15, said solder sphere backing aperture pattern comprising two sphere backing ribs, said two sphere backing ribs crossing at a point proximate a center of said backing aperture.

18. The solder sphere placement apparatus of claim 15, wherein said plurality of backing aperture patterns is provided in an array having an even number of rows and an even number of columns and said array is centered within said solder sphere placement backing plate.

19. The solder sphere placement apparatus of claim 15, wherein said plurality of backing aperture patterns is provided in an array having an odd number of rows and an odd number of columns and said array is centered within said solder sphere placement backing plate.

20. The solder sphere placement apparatus of claim 15, said solder sphere placement backing plate further comprising a plurality of adhesive enhancing apertures.

* * * * *